United States Patent
Ohara et al.

(10) Patent No.: US 11,152,594 B2
(45) Date of Patent: Oct. 19, 2021

(54) DISPLAY DEVICE

(71) Applicant: Japan Display Inc., Tokyo (JP)

(72) Inventors: Hiroki Ohara, Tokyo (JP); Akinori Kamiya, Tokyo (JP)

(73) Assignee: Japan Display Inc., Tokyo (JP)

( * ) Notice: Subject to any disclaimer, the term of this patent is extended or adjusted under 35 U.S.C. 154(b) by 105 days.

(21) Appl. No.: 16/737,340

(22) Filed: Jan. 8, 2020

(65) Prior Publication Data
US 2020/0227679 A1     Jul. 16, 2020

(30) Foreign Application Priority Data

Jan. 11, 2019  (JP) .............................. JP2019-003060

(51) Int. Cl.
*H01L 51/52* (2006.01)
*H01L 27/32* (2006.01)

(52) U.S. Cl.
CPC ...... *H01L 51/5253* (2013.01); *H01L 27/3232* (2013.01); *H01L 51/5293* (2013.01)

(58) Field of Classification Search
CPC .............. B32B 7/02–028; H01L 51/524–5256
See application file for complete search history.

(56) References Cited

U.S. PATENT DOCUMENTS

2013/0313547 A1   11/2013  Nakano et al.
2016/0036000 A1*   2/2016  Choi .................... H01L 51/5253
                                                                  257/40

FOREIGN PATENT DOCUMENTS

JP           2013-243094 A     12/2013

* cited by examiner

*Primary Examiner* — Daniel P Shook
(74) *Attorney, Agent, or Firm* — Michael Best & Friedrich LLP

(57) ABSTRACT

A display device includes a first substrate, a display region arranged with a pixel including a light emitting element above the first substrate, a first inorganic insulating layer covering the display region, an organic insulating layer arranged above the first inorganic insulating layer, a second inorganic insulating layer arranged above the organic insulating layer and having a N—H bond total weight measured by an FT-IR method lower than a N—H bond total weight per unit [% area] of the first inorganic insulating layer, and a polarizing plate arranged above the second inorganic insulating layer.

19 Claims, 14 Drawing Sheets

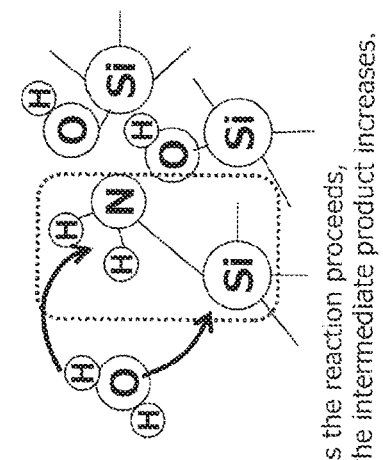
Fig. 4A
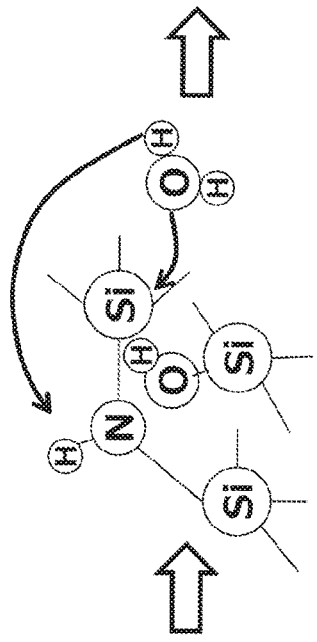
Fig. 4B
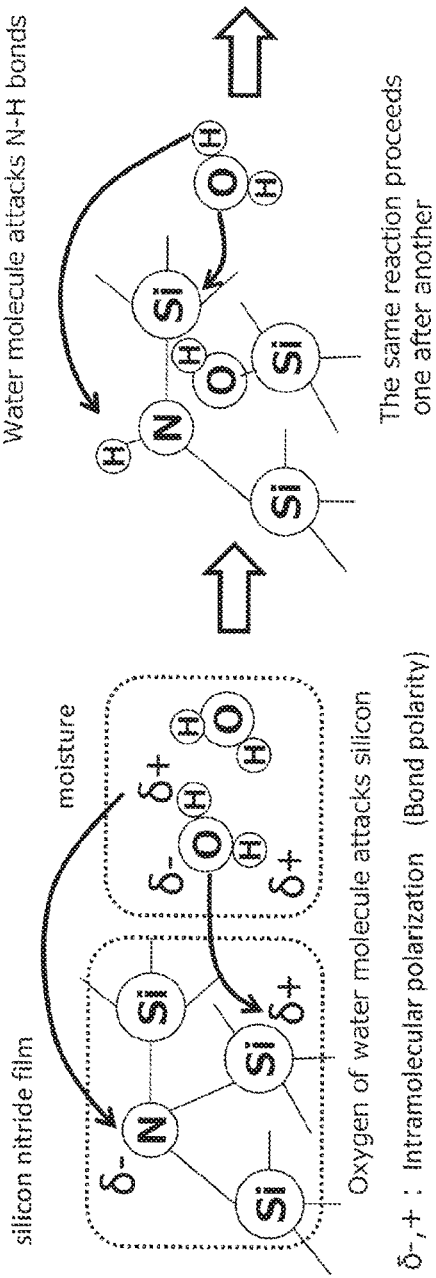
Fig. 4C
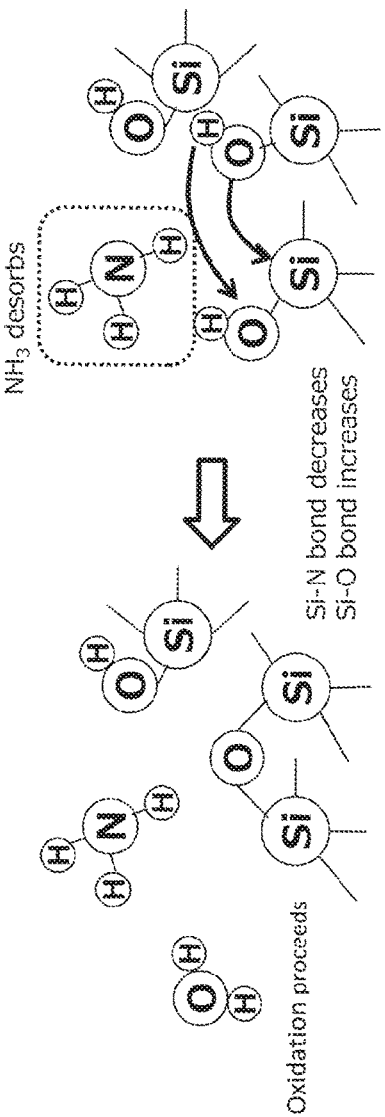
Fig. 4D
Fig. 4E

DISPLAY DEVICE

CROSS REFERENCE TO RELATED APPLICATIONS

This application is based upon and claims the benefit of priority from the prior Japanese Patent Application No. 2019-3060, filed on Jan. 11, 2019, the entire contents of which are incorporated herein by reference.

FIELD

One embodiment of the present invention is related to a display region in a display device.

BACKGROUND

Conventionally, an organic EL display device (Organic Electroluminescence Display) using an organic electroluminescence material (organic EL material) in a light emitting element (organic EL element) of a display region has been known as a display device. An organic EL display device is a so-called self-light emitting type display device which realizes a display by causing an organic EL material to emit light.

A light emitting element included in a display region deteriorates due to moisture. The deterioration of a light emitting element is suppressed by arranging a sealing film above the light emitting element in order to prevent the entrance of moisture to the light emitting element. For example, a display device is disclosed in patent document 1 (Japanese Laid Open Patent Publication No: 2013-243094) in which a first sealing film and a second sealing film comprised form an inorganic material such as a silicon nitride film or silicon oxide film are arranged above a light emitting element.

SUMMARY

A display device in an embodiment according to the present invention includes a first substrate, a display region arranged with a pixel including a light emitting element above the first substrate, a first inorganic insulating layer covering the display region, an organic insulating layer arranged above the first inorganic insulating layer, a second inorganic insulating layer arranged above the organic insulating layer and having a N—H bond total weight measured by an FT-IR method lower than a N—H bond total weight per unit [% area] of the first inorganic insulating layer, and a polarizing plate arranged above the second inorganic insulating layer.

A display device in an embodiment according to the present invention includes a first substrate, a display region arranged with a pixel including a light emitting element above the first substrate, a first inorganic insulating layer covering the display region, an organic insulating layer arranged above the first inorganic insulating layer, a second inorganic insulating layer arranged above the organic insulating layer, a first electrode arranged above the second inorganic insulating layer, a third inorganic insulating layer arranged above the first electrode and having a N—H bond total weight measured by an FT-IR method lower than a N—H bond total weight per unit [% area] of the first inorganic insulating layer; and a second electrode arranged above the third inorganic insulating layer and electrically connected to the first electrode.

BRIEF DESCRIPTION OF DRAWINGS

FIG. 4A is a diagram for explaining a mechanism for desorbing $NH_3$ from a film including nitrogen;

FIG. 4B is a diagram for explaining a mechanism for desorbing $NH_3$ from a film including nitrogen;

FIG. 4C is a diagram for explaining a mechanism for desorbing $NH_3$ from a film including nitrogen;

FIG. 4D is a diagram for explaining a mechanism for desorbing $NH_3$ from a film including nitrogen;

FIG. 4E is a diagram for explaining a mechanism for desorbing $NH_3$ from a film including nitrogen;

DESCRIPTION OF EMBODIMENTS

Figure 1:
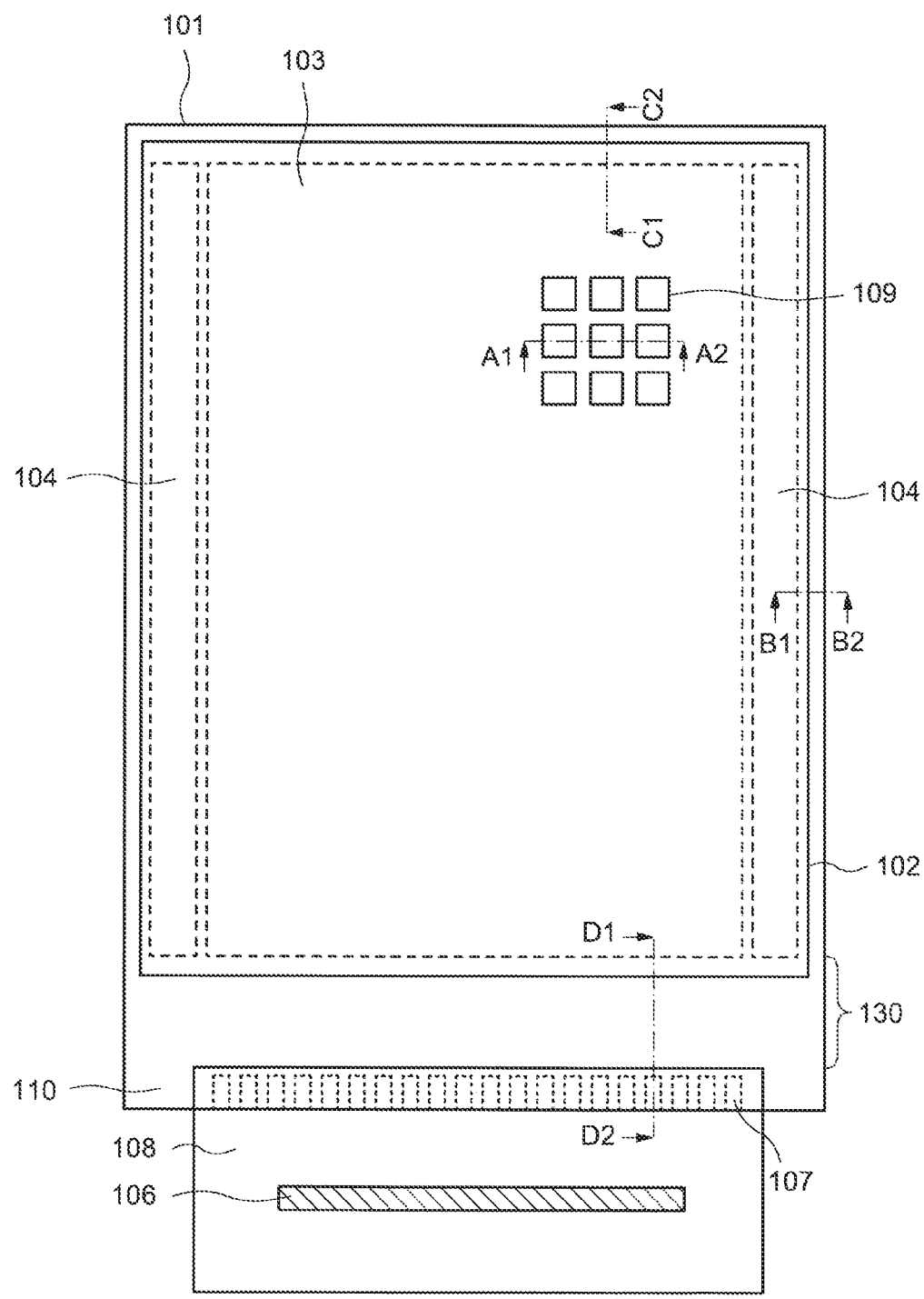
FIG. 1 is a schematic view showing a structure of a display device related to one embodiment of the present invention.

Each embodiment of the present invention is explained below while referring to the drawings. However, the present invention can be implemented in various modes without departing from the gist of the invention and should not to be interpreted as being limited to the description of the embodiments exemplified below.

Although the drawings may be schematically represented in terms of width, thickness, shape, and the like of each part as compared with their actual mode in order to make explanation clearer, it is only an example and an interpretation of the present invention is not limited. In addition, in the drawings, the same reference numerals are provided to the same elements as those described above with reference to preceding figures and repeated explanations may be omitted accordingly.

In the case when a single film is processed to form a plurality of structural bodies, each structural body may have different functions and roles, and the bases formed beneath each structural body may also be different. However, the plurality of structural bodies are derived from films formed in the same layer by the same process and have the same material. Therefore, the plurality of these films are defined as existing in the same layer.

When expressing a mode in which another structure is arranged above a certain structure, in the case where it is simply described as [above], unless otherwise noted, a case where another structure is arranged directly above a certain structure as if in contact with that structure, and a case where another structure is arranged via another structure above a certain structure, are both included.

The expression [a certain structure is exposed from another structure] means a region where a part of a certain structure is not covered by another structure. However, the part which is not covered by another structure also includes the case where it is covered by yet another structure.

First Embodiment

An example of the structure of a display device 100 according to one embodiment of the present invention is explained while referring to FIG. 1 to FIG. 8.
<Display Device Structure>
FIG. 1 is a planar view of a display device 100 related to one embodiment of the present invention. A substrate 101 includes a display region 103, a periphery region 110 which surrounds the display region 103, a scanning line drive circuit 104 arranged in the periphery region 110, a plurality of terminals 107 arranged at an end part of the substrate 101, and a bent region 130 arranged between the display region 103 and the plurality of terminals 107. In addition, a polarizing plate 102 is arranged overlapping the display region 103 and the scanning line drive circuit 104.

The display region 103 includes a plurality of pixels 109 and the plurality of pixels 109 are arranged in a matrix.

The periphery region 110 is a region from the display region 103 to the end part of the substrate 101. In other words, the periphery region 110 is a region where the display region 103 is arranged above the substrate 101 (that is, a region outside of the display region). The scanning line drive circuit 104 and the plurality of terminals 107 are arranged provided in the periphery region 110. The scanning line drive circuits 104 are arranged to oppose the display region 103. The plurality of terminals 107 are connected to a flexible printed circuit substrate 108. A driver IC 106 is arranged above the flexible printed circuit substrate 108.

The bent region 130 is a region where the substrate 101 is bent. In the bent region 130, the frame of the display device 100 can be narrowed by bending the substrate 101 so that the plurality of terminals 107 of the substrate 101 overlap with the rear surface of the display region 103.

An image signal and various control signals are supplied from a controller (not shown in the diagram) external to the display device 100 via the flexible printed circuit substrate 108. The image signal is processed by the driver IC 106 and input to the plurality of pixels 109. Each circuit signal is input to the scanning line drive circuit 104 via the driver IC 106.

In addition to the image signal and each drive circuit, power for driving the scanning line drive circuit 104, the driver IC 106 and the plurality of pixels 109 is supplied to the display device 100. Each of the plurality of pixels 109 includes a light emitting element 240 which is described later. A part of the power which is supplied to the display device 100 is supplied to the light emitting element 240 included in each of the plurality of pixels 109 and causes the light emitting element 240 to emit light.

Figure 2:
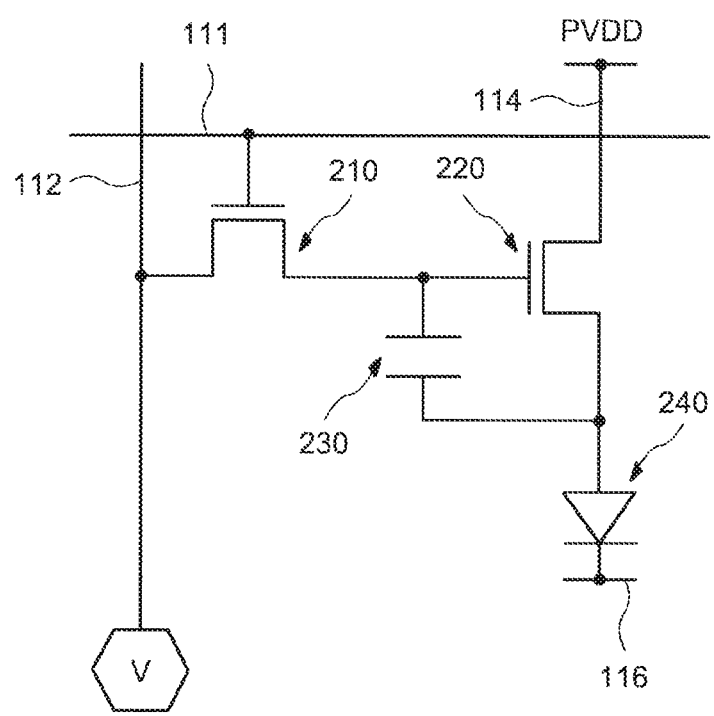
FIG. 2 is a circuit diagram of a pixel in a display device related to one embodiment of the present invention.

<Pixel Circuit>
FIG. 2 is a pixel circuit included in each of the plurality of pixels 109 arranged in the display device 100 related to the present invention. The pixel circuit includes at least a transistor 210, a transistor 220, a capacitor 230 and a light emitting element 240.

The transistor 210 functions as a selection transistor. That is, in the transistor 210, the conduction state of the gate of the transistor 210 is controlled by a scanning line 111. The gate of the transistor 210 is connected to the scanning line 111, a source is connected to the signal line 112, and a drain is connected to a gate of the transistor 220.

The transistor 220 functions as a drive transistor. That is, the transistor is connected to the light emitting element 240 and controls the light emitting luminosity of the light emitting element 240. A gate of the transistor 220 is connected to a source of the transistor 210, the source is connected to a drive power supply line 114, and a drain connected to an anode of the light emitting element 240.

One capacitor electrode of the capacitor 230 is connected to the gate of the transistor 220 and connected to the drain of the transistor 210. In addition, the other capacitor electrode is connected to the anode of the light emitting element 240 and the drain of the transistor 220.

Figure 3:
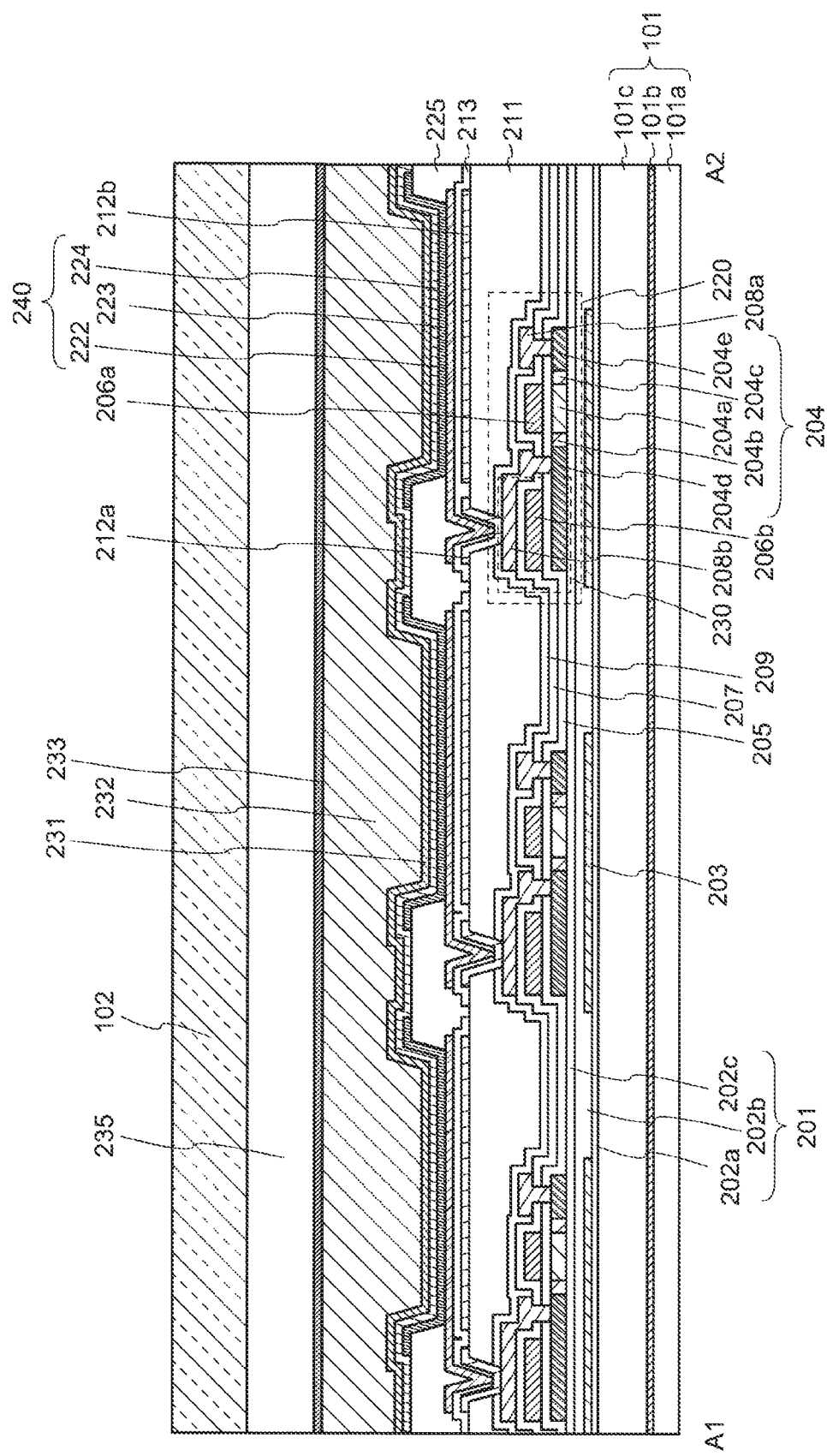
FIG. 3 is a cross-sectional view of a pixel in a display device related to one embodiment of the present invention.

The anode of the light emitting element 240 is connected to the drain of the transistor 220 and a cathode is connected to the reference power line 116.
<Display Region Structure>
FIG. 3 is a cross-sectional view in the case where the display device 100 shown in FIG. 1 is cut along the line A1-A2. FIG. 3 is a cross-sectional view of the pixel 109 of the display device 100 related to one embodiment of the present invention.

The substrate 101 has a stacked layer structure including a first resin layer 101a, an inorganic layer 101b and a second resin layer 101c. The first resin layer 101a and the second resin layer 101c are formed as layers including a material selected from, for example, acrylic, polyimide, polyethylene terephthalate, and polyethylene naphthalate and the like. In addition, silicon nitride, silicon oxide or amorphous silicon is used as the inorganic layer 101b. It is preferred that the inorganic layer 101b is arranged between the first resin layer 101a and the second resin layer 101c in order to improve adhesion between the first resin layer 101a and the second resin layer 101c.

An undercoat layer 202 is arranged on the substrate 101. The undercoat layer 202 is arranged by, for example, a single layer or a stacked layer of a silicon oxide film and a silicon nitride film. In the present embodiment, the undercoat layer 202 is arranged by stacking three layers of a silicon oxide layer 202a, a silicon nitride layer 202b and a silicon oxide layer 202c. Since the silicon oxide layer 202a is used to improve adhesion to the substrate, the silicon nitride layer 202b is used as a blocking film for moisture and impurities from the exterior, the silicon oxide layer 202c functions as a blocking film to ensure that hydrogen included in the silicon nitride layer 202b described later is prevented from diffusing to the semiconductor layer side.

In addition, the undercoat layer 202 may be arranged with a light shielding layer 203 to match the location where the transistor 220 is arranged. Since the light shielding layer 203 suppresses changes in transistor characteristics due to entrance of light from the back surface of a channel of the transistor 220, or forms the light shielding layer 203 as a conductive layer, it is possible to impart the transistor 220 with back-gate effects by providing a predetermined potential to the transistor 220. That is, the undercoat layer 202 is arranged with the silicon oxide layer 202a, the light shielding layer 203, the silicon nitride layer 202b and the silicon oxide layer 202c.

The transistor 220 is arranged above the undercoat layer 202. The transistor 220 includes a semiconductor layer 204, a gate insulating film 205 and a gate electrode 206a. Although an example is shown in which a n-channel transistor is used as the transistor 220, a p-channel transistor may also be used. In the present embodiment, a n-channel TFT has a structure in which low concentration impurity regions 204b and 204c are arranged between a channel region 204a and source or drain regions 204d and 204e (high concentration impurity regions). Amorphous silicon, polysilicon, or an oxide semiconductor is used as the semiconductor layer 204. For example, silicon oxide or silicon nitride is arranged as a single layer or a stacked layer as the gate insulating film 205. For example, MoW is used as the gate electrode 206a. Furthermore, although the structure of the transistor 220 is shown in FIG. 3, the structure of the transistor 210 is similar to the structure of the transistor 220.

An interlayer insulating layer 207 is arranged to cover the gate electrode 206a. The interlayer insulating layer 207 is arranged with a single layer or a stacked layer of a silicon oxide layer or a silicon nitride layer. Source or drain electrodes 208a and 208b are arranged above the interlayer insulating layer 207. Each of the source or drain electrodes 208a and 208b is connected to the source or drain regions 204d and 204e of the semiconductor layer 204 via opening parts in the interlayer insulating layer 207 and the gate insulating film 205.

Here, a conductive layer 206b is arranged above the gate insulating film 205. The conductive layer 206b is formed in the same process as the gate electrode 206a. The conductive layer 206b forms a capacitor by the source or drain regions 204d and 204e of the semiconductor layer 204 interposed by the gate insulating film 205. In addition, the conductive layer 206b forms a capacitor by the source or drain electrode 208b interposed by the interlayer insulating layer 207.

A planarization film 211 is arranged above the source or drain electrodes 208a and 208b.

An insulating layer 213 is arranged above the planarization film 211. An organic material such as photosensitive acrylic or polyimide is used as the planarization film 211. By arranging the planarization film 211, it is possible to planarize a step caused by the transistor 220.

Transparent conductive films 212a and 212b are arranged above the planarizing film 211. The transparent conductive film 212a is connected to the source or drain electrode 208b through the opening part of the planarization film 211 and the insulating layer 209.

An insulating layer 213 is arranged above the transparent conductive films 212a and 212b. The insulating layer 213 is arranged with openings parts in a region which overlaps the transparent conductive film 212a and the source or drain electrode 208b, and a region between the transparent conductive film 212a and the transparent conductive film 212b of an adjacent pixel.

A pixel electrode 222 is arranged above the insulating layer 213. The pixel electrode 222 is connected to the transparent conductive film 212a through the opening part of the insulating layer 213. The pixel electrode 222 is formed as a reflective electrode and has a three layer structure of IZO, Ag, and IZO.

An insulating layer 225 which becomes a partition wall is arranged at the boundary between a pixel electrode 222 and the pixel electrode 222 of the adjacent pixel. The insulating layer 225 is also called a bank or a rib. An organic material similar to the material of the planarization film 211 is used for the insulating layer 225. The insulating layer 225 is opened so that a part of the pixel electrode 222 is exposed. In addition, it is preferred that the end part of an opening part takes on a gentle taper shape. When the end part of the opening has a steep shape, coverage failure occurs in the organic layer 223 which is formed later.

Here, the planarization film 211 and the insulating layer 225 contact with each other at an opening part arranged in the insulating layer 225. By including such a structure, it is possible to remove moisture and gas which are released from the planarization film 211 when carrying out heat treatment when the insulating layer 225 is formed. In this way, it is possible to suppress peeling at the interface between the planarization film 211 and the insulating layer 225.

After forming the insulating layer 225, an organic layer 223 for forming an organic EL layer is stacked. Although the organic layer 223 is shown as a single layer in FIG. 3, a hole transport layer, a light emitting layer and an electron transport layer are stacked in that order from the pixel electrode 222 side. In addition, although the light emitting layer in the organic layer 223 is described as being selectively arranged for each pixel 109 in FIG. 3, a hole transport layer and an electron transport layer may also be arranged in all over the display region 103. These layers may be formed by vapor deposition, or may be formed by coating on a solvent dispersion. Not only the hole transport layer and the electron transport layer, but a light emitting layer may also be arranged in all over the display region 103. In the case where the light emitting layer is arranged in all over the display region 103, white light can be obtained in all the pixels and it is possible to adopt a structure in which a desired color wavelength part can be extracted by a color filter (not shown in the diagram).

After formation of the organic layer 223, the counter electrode 224 is formed. Here, since a top emission structure is adopted, the counter electrode 224 is required have light translucency. Furthermore, a top emission structure means a structure in which light is emitted from the counter electrode 224 which is arranged above the pixel electrode 222 interposed by the organic layer 223. Here, an MgAg film is formed as a thin film which allows light emitted from the organic EL layer to pass therethrough as the counter electrode 224. According to the order of formation of the organic layer 223 described above, the pixel electrode 222 side becomes an anode, and the counter electrode 224 side becomes a cathode.

A sealing film 260 is arrange above the counter electrode 224 of the light emitting element 240. The sealing film 260 has a function for preventing moisture from entering the organic layer 223 from the exterior, and the sealing film 260 is required to have high gas barrier properties. A film containing nitrogen can be given as an example of a film having such a function. Here, a structure is shown in which a first inorganic insulating layer 231, an organic insulating layer 232 and a second inorganic insulating layer 233 are stacked as the sealing film 260 including a film containing nitrogen.

A resin mask 235 is arranged to cover the display region 103. For example, an acrylic, rubber, silicone, urethane, or epoxy organic resin can be used for the resin mask 235. In addition, the resin mask 235 may include a water-absorbing substance such as calcium or zeolite. By including a water-absorbing substance in the resin mask 235, it is possible to delay the arrival of moisture to the light emitting element 240 even when moisture enters the interior of the display device 100. Here, the thickness of the resin mask 235 is about 10 μm.

A polarizing plate 102 is arranged above the resin mask 235. The polarizing plate 102 has a laminated structure including a quarter wavelength plate and a linear polarizing plate. By adopting this structure, it is possible to emit light from the light emitting region to the exterior from the display side surface of the polarizing plate 102. Here, the thickness of the polarizing plate 102 is 100 μm to 200 μm.

As explained above, by arranging a sealing film above the light emitting element 240, it is possible to suppress moisture which has entered from the exterior from entering the light emitting element 240. However, moisture entering from the exterior reacts with a film including nitrogen and ammonium ions are generated. In addition, moisture which is included in the resin mask 235 reacts with the film including nitrogen and ammonium ions are generated.

<Mechanism of Ammonia Ion Generation>

Next, in the case when a silicon nitride film is used as a film including nitrogen, moisture which enters from the exterior or moisture included the organic resin reacts with the silicon nitride film which generates ammonium ions. This mechanism is explained using FIG. 4A to FIG. 4E.

As shown in FIG. 4A, moisture which is included in the resin mask 235 and oxygen of the moisture which enters from the exterior attack the silicon of the silicon nitride film. Next, as shown in FIG. 4B, moisture attacks not only the silicon of the silicon nitride film but also the N—H bond. As the reaction proceeds, the intermediate product ≡Si—N—H$_2$ increases as shown in FIG. 4C. As the reaction proceeds further, NH$_3$ is desorbed from the silicon nitride film as shown in FIG. 4D. Finally, Si—N bonds decrease and Si—O bonds increase. That is, as shown in FIG. 4E, the silicon nitride film becomes oxidized by moisture.

As was explained above, a film including nitrogen contained in the sealing film which is arranged above the light emitting element generates ammonia due to hydrolysis. If moisture is not sufficiently removed from within the light emitting element, ammonia is generated from the film including nitrogen due to the movement of moisture to the sealing film. In this way, when alkaline ammonium ions are generated due to moisture, the ammonium ions reach the polarizing plate and attack the iodine complex of the polarizing plate. In this way, there is a problem whereby color loss occurs in the polarizing plate and a defect occurs in the display screen.

When NH$_3$ which is desorbed from a silicon nitride film reaches a polarizing plate through a resin mask, the iodine complex of the polarizing plate 102 is attacked. In this way, there is a problem whereby the polarizing plate is changed to white and a defect occurs on the display screen.

An object of the present invention is to suppress the generation of ammonia in a sealing film and to suppress color loss of a polarization plate.

In the display device 100 according to one embodiment of the present invention, the second inorganic insulating layer 233 which is in contact with the resin mask 235 is a film which is more difficult to oxidize than the first inorganic insulating layer 231. That is, the N—H bond amount per unit area [% area] of the second inorganic insulating layer 233 measured by the FT-IR method is smaller than the N—H bond amount per unit area [% area] of the first inorganic insulating layer. For example, the total thickness of the first inorganic insulating layer 231 and the second inorganic insulating layer 233 is preferred to be 1500 m or less.

The fact that the second inorganic insulating layer 233 is difficult to oxidize can be indicated by the thickness of the surface oxidation region of the second inorganic insulating layer 233, for example. For example, the thickness of the surface oxidation on the side surface of the second inorganic insulating layer 323 is sufficient to be smaller than the thickness of the surface oxidation region on the side surface of the first inorganic insulating layer 321. The thickness of the surface oxidation region of the second inorganic insulating layer 233 is preferred to be 60 nm or less, for example.

In addition, the density of the second inorganic insulating layer 233 is preferred to be higher than the density of the first inorganic insulating layer 231. For example, the etching rate of the second inorganic insulating layer 233 using 1% buffered hydrofluoric acid is preferred to be slower than the etching rate of the first inorganic insulating layer 231.

The third inorganic insulating layer 234 is a film that is more difficult to oxidize than the first inorganic insulating layer 231 or is a dense film, and it is possible to suppress a reaction between moisture included in the resin mask 235 or moisture entering from the exterior with the second inorganic insulating layer 233. That is, it is possible to suppress the generation of ammonia. Therefore, since it is possible to suppress ammonia from reaching the polarization plate 102 through the resin mask 235, it is possible to suppress color loss of the polarization plate 102. In this way, it is possible to improve the reliability of the display device 100.

In the display device 100, a cover glass may be arranged above the polarization plate 102 according to necessity. A touch sensor or the like may also be formed on the cover glass. In this case, a filler using a resin or the like may be used in order to fill a gap between the polarization plate 102 and the cover glass.

<Method for Manufacturing Display Device>

Figure 5A:
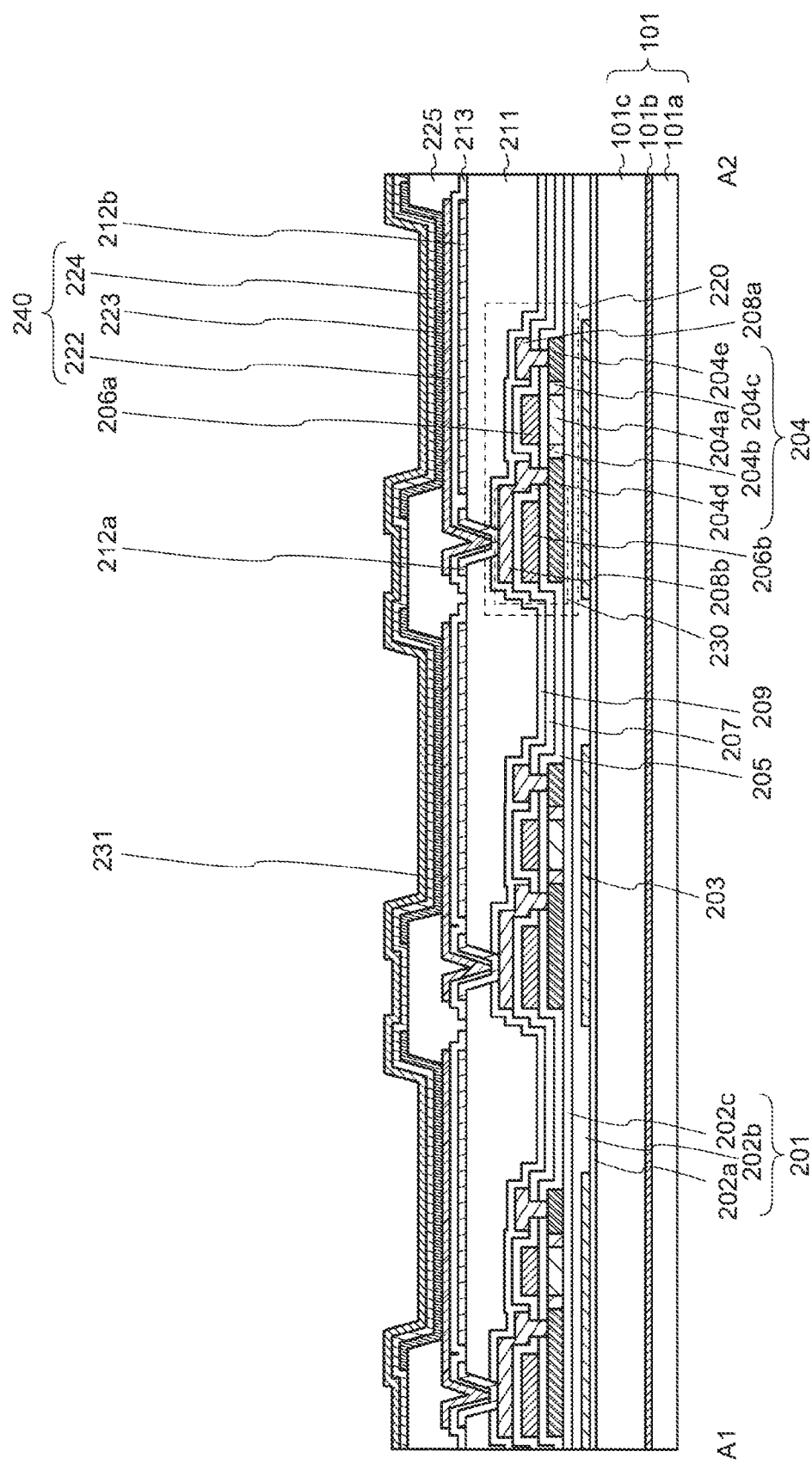
FIG. 5A is cross-sectional view explaining a manufacturing method of a display device related to one embodiment of the present invention.
Figure 5B:
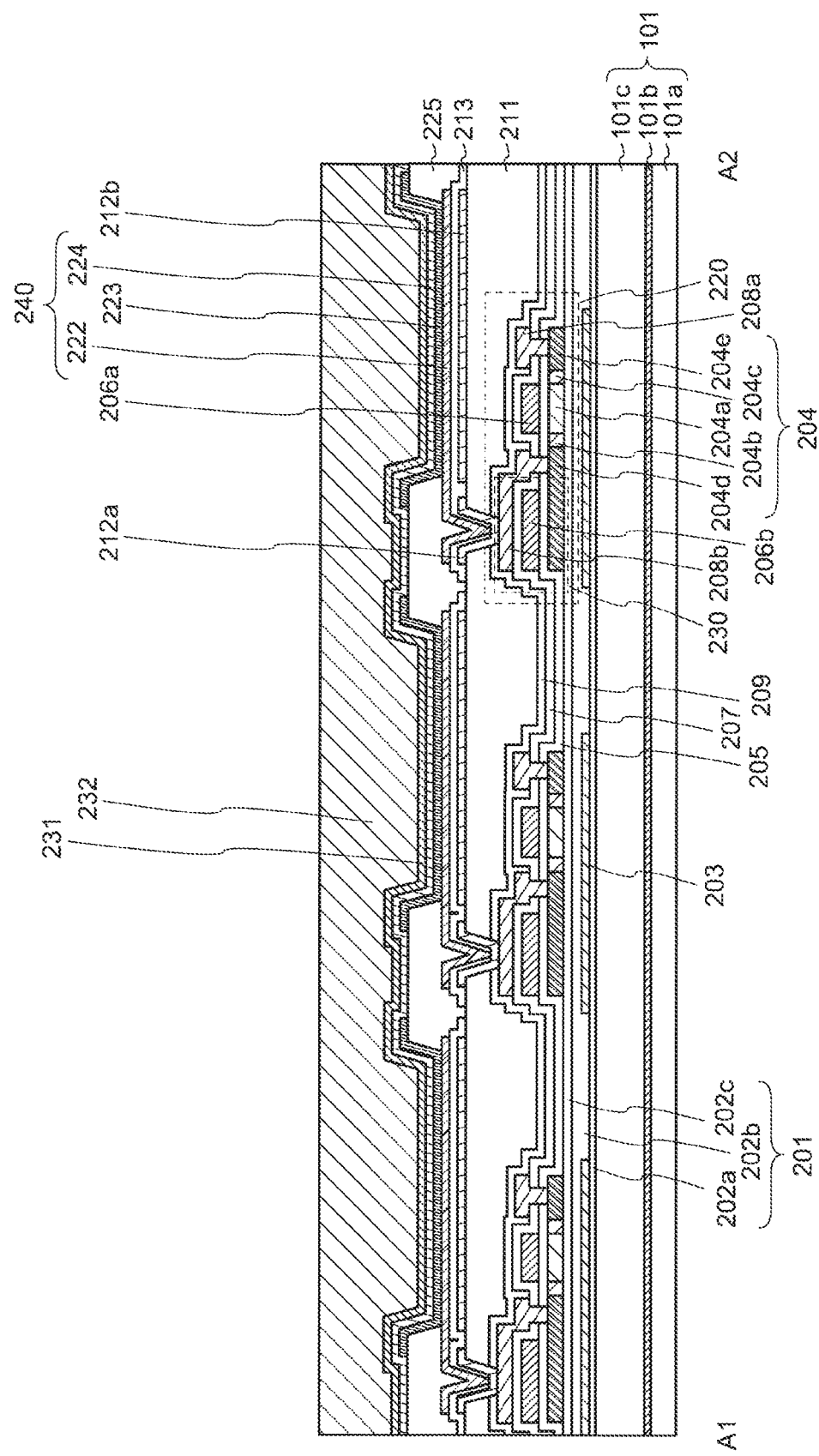
FIG. 5B is cross-sectional view explaining a manufacturing method of a display device related to one embodiment of the present invention.
Figure 5C:
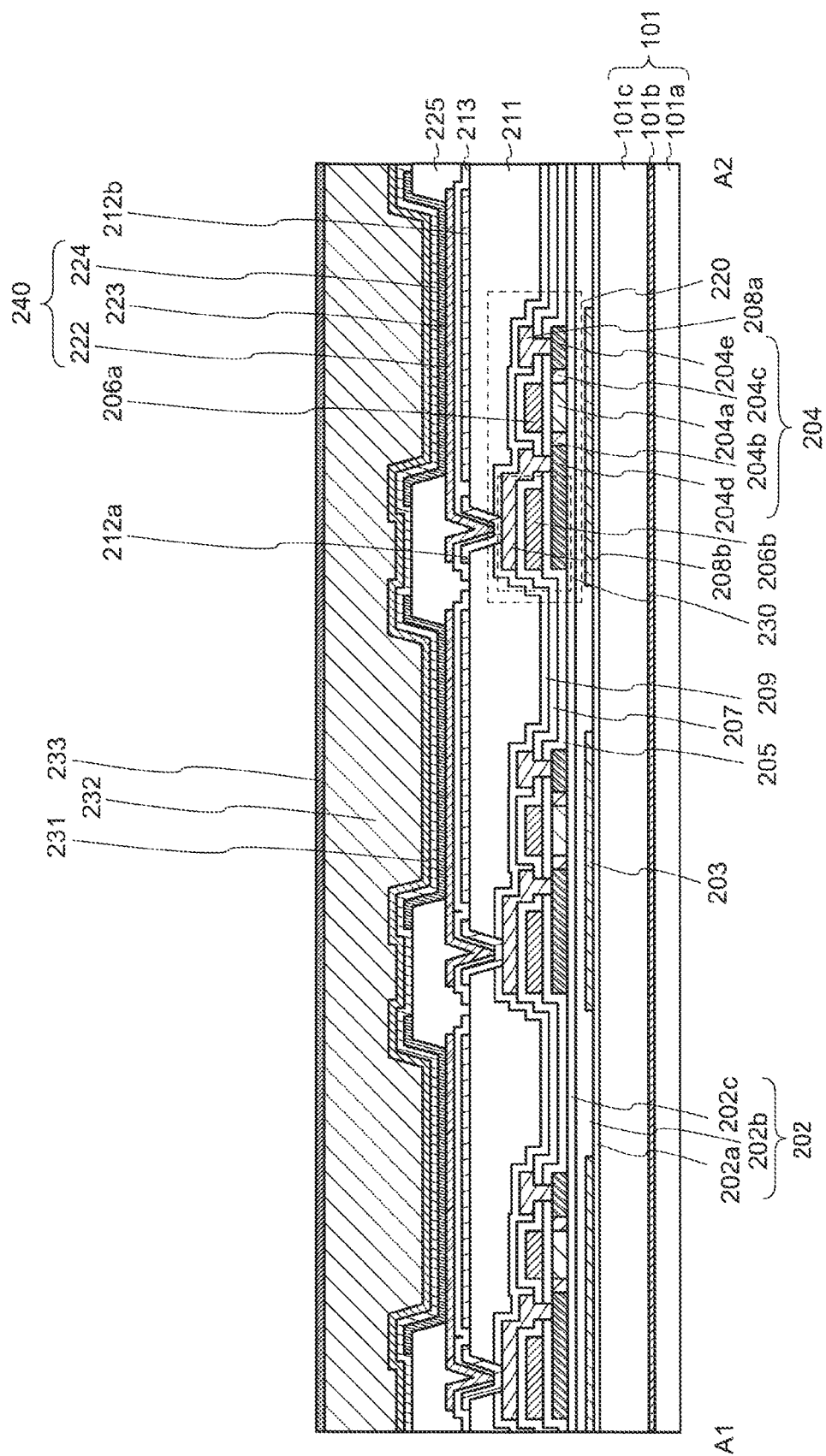
FIG. 5C is cross-sectional view explaining a manufacturing method of a display device related to one embodiment of the present invention.

Next, a method for manufacturing the display device 100 related to one embodiment of the present invention is explained while referring to FIG. 5A to FIG. 5C.

FIG. 5A is a cross-sectional view showing a method for manufacturing the display device 100 related to one embodiment of the present invention. A detailed description of a method for forming the substrate 101 to the counter electrode 224 included in the light emitting element 240 is omitted.

A sealing film 260 is formed above the counter electrode 224 of the light emitting element 240. First, the first inorganic insulating layer 231 is formed as the sealing film 260. The first inorganic insulating layer 231 is preferred to be formed by a film containing nitrogen in order to suppress moisture from entering the light emitting element 240, and for example, a silicon nitride film and an aluminum nitride film or the like is used as the film containing nitrogen. In the present embodiment, the case where a silicon nitride film is used as the first inorganic insulating layer 231 is explained.

In addition, it is preferred to perform a surface treatment by performing a plasma treatment before forming the first inorganic insulating layer 231. The plasma treatment is preferred to be performed using N$_2$O or O$_2$. Adhesion can be improved performing a plasma treatment before forming the first inorganic insulating layer 231. In addition, an auxiliary layer may also be arranged between the counter electrode 224 and the first inorganic insulating layer 231. For example, a silicon oxide film or a silicon oxynitride film is used as the auxiliary layer at a thickness of 5 nm or more 100 nm or less and 10 nm or more and 50 nm or less is preferred.

The first inorganic insulating layer 231 is formed by a CVD method with a gas flow rate ratio of $SiH_4:NH_3:N_2:H_2=1.1:1:16.2:9.2$ as the film formation condition 1. In addition, RF Power [W]/(SiH$_4$+NH$_3$) [sccm]=2.2 is assumed as the power efficiency. In addition, the NH$_3$ flow rate ratio (NH$_3$)/(SiH$_4$+NH$_3$+N$_2$+H$_2$)×100 [%] during CVD film formation is set to 3.6. Furthermore, since the light emitting element 240 deteriorates when a high temperature is applied, the first inorganic insulating layer 231 cannot be formed by a high temperature process. Therefore, the first inorganic insulating layer 231 is preferred to be formed at a film formation temperature of 100° C. or less. In addition, in the case when the first inorganic insulating layer 231 is formed with a thickness of 1 μm, it is preferred to perform film formation several times in order to suppress pinholes and coverage defects. For example, in the case where the first inorganic insulating layer 231 is formed with a thickness of 1 μm, first, after forming a film with a thickness of 500 nm, it is then formed with a thickness of 500 nm. Furthermore, in the case when the film thickness of the second inorganic insulating layer 233 explained later is also increased, it is preferred to perform the film formation process in several times.

For example, an acrylic resin, an epoxy resin, a polyimide resin, a silicone resin, a fluorine resin and a siloxane resin or the like can be used as the organic insulating layer 232 (FIG. 5B). The film thickness of the organic insulating layer 232 is preferred to be 5 μm or more and 15 μm or less for example.

The second inorganic insulating layer 233 is formed by a CVD method with a gas flow ratio of SiH$_4$:NH$_3$:N$_2$:H$_2$=2:1:36:4 as a film formation condition 2 (FIG. 5C). In addition, RF Power [W]/(SiH$_4$+NH$_3$) [sccm]=3.2 is assumed as the power efficiency. In addition, the NH$_3$ flow rate ratio (NH$_3$/(SH$_4$+NH$_3$+N$_2$+H$_2$)×100 [%] during CVD film formation is set to 2.3. The film formation temperature of the second inorganic insulating layer 233 is preferred to be 100° C. or less, similar to the first inorganic insulating layer 231. In addition, it is preferred to perform a surface treatment by performing a plasma treatment before forming the second inorganic insulating layer 233. The plasma treatment is preferred to be performed using N$_2$O or O$_2$. It is possible to improve adhesion by performing a plasma treatment before forming the second inorganic insulating layer 233. In addition, an auxiliary layer may also be arranged between the counter electrode 224 and the first inorganic insulating layer 231. For example, a silicon oxide film or a silicon oxynitride film is used as the auxiliary layer with a thickness of 5 nm or more and 100 nm or less, and preferably 10 nm or more and 50 nm or less.

The second inorganic insulating layer 233 is formed by a CVD method with a gas flow rate ratio of SiH$_4$:NH$_3$:N$_2$:H$_2$=2:1:36:4 as the film formation condition 3. At this time, the film forming condition 3 is set to a low pressure and formed with a narrow gap with respect to the film forming condition 2. Specifically, the pressure may be set to (film formation condition 2: film formation condition 3=5:4), and the gap between the electrodes may be set as (film formation condition 2: film formation condition 3=37:33). In addition, RF Power [W]/(SiH$_4$+NH$_3$) [sccm]=3.2 may be set as the power efficiency. In addition, the NH$_3$ flow rate ratio (NH$_3$)/(SiH$_4$+NH$_3$+N$_2$+H$_2$)×100 [%] during CVD film formation is set to 2.3. The film formation temperature of the second inorganic insulating layer 233 is preferred to be 100° C. or less similar to the first inorganic insulating layer 231.

The results of a Rutherford backscattering analysis (RBS)/elastic recoil detection analysis (ERDA) of the silicon nitride film which is deposited under the film formation condition 1 are, for example, Si: 33%, N: 39.1%, H: 31.8%, N/Si=1.17, H/Si=0.83, and film density [g/cm$^3$]: 2.0. The RBS/ERDA results of the silicon nitride film formed under the film formation condition 2 are, for example, Si: 32.6%, N: 38.0%, H: 29.4, film density [g/cm$^3$]: 2.1. The RBS/ERDA result for the silicon nitride film formed under the film forming condition 3 are, for example, Si: 32.6%, N: 38.0%, H: 29.4, film density [g/cm$^3$]: 2.1.

The FT-IR analysis results of a silicon nitride film formed under the film forming condition 1 are Si—N: 70, Si—H: 17.2, and N—H: 12.8. In addition, the FT-IR analysis results of the silicon nitride film formed under the film forming condition 2 are Si—N: 88.4, Si—H: 5.63, and N—H: 5.96. In addition, the FT-IR analysis results of the silicon nitride film formed under the film formation condition 3 are Si—N: 86.1, Si—H: 10.6, and N—H: 3.36. From the FT-IR analysis results, the N—H bond amount of the silicon nitride film formed under the film formation conditions 2 and 3 can be made smaller than the N—H bond amount of the silicon nitride film formed under the film formation condition 1.

A silicon nitride film formed under the film forming condition 1 has an etching rate of, for example, 10.34 [nm/sec] using a 1% buffered hydrofluoric acid. In addition, a silicon nitride film formed under the film forming condition 2 has an etching rate of, for example, 6.14 [nm/sec] using a 1% buffered hydrofluoric acid. In addition, a silicon nitride film formed under the film forming condition 3 has an etching rate of, for example, 6.8 [nm/sec] using a 1% buffered hydrofluoric acid. Therefore, it can be said that the silicon nitride film formed under the film formation conditions 2 and 3 is a denser film than the silicon nitride film formed under the film formation condition 1.

In the case when the first inorganic insulating layer 321 is formed under the film formation condition 1 and the second inorganic insulating layer 323 is formed under the film formation conditions 2 and 3, the density of the second inorganic insulating layer 323 becomes higher than the density of the first inorganic insulating layer 321.

When a high temperature and high humidity test is performed for 48 hours under an environment of a temperature of 120° C. and a humidity of 100% with respect to the first inorganic insulating layer 231 formed under the first film forming conditions, the first inorganic insulating layer 231 is oxidized from the surface by about 150 nm to 300 nm. When a high temperature and high humidity test is performed for 48 hours in an environment of a temperature of 120° C. and a humidity of 100% with respect to the second inorganic insulating layer 233 formed under the second film forming conditions, the second inorganic insulating layer 233 is oxidized from the surface by about 60 nm. When a high temperature and high humidity test is performed for 48 hours in an environment of a temperature of 120° C. and a humidity of 100% the second inorganic insulating layer 233 formed under the third film formation conditions is oxidized from the surface by about 30 nm. That is, it is possible to suppress surface oxidation more in the silicon nitride film formed under the film formation conditions 2 and 3 than in the silicon nitride film formed under the film formation condition 1. That is, the fact that it is possible to suppress the surface oxidation of the silicon nitride film means that the detachment of ammonium from the silicon nitride film is suppressed.

The silicon nitride film which is formed under the film formation condition 1 has a high film formation rate and has a low formation stress, and a low refractive index n and extinction coefficient k. In addition, the silicon nitride film formed under the film formation condition 2 has a low film formation rate compared to the film formation condition 1, a higher film stress, but an equivalent refractive index n and extinction coefficient k. In addition, although the silicon nitride film formed under the film formation condition 3 has the same film stress compared to the film forming condition 1, the film forming rate is low, and the refractive index n and the extinction coefficient k are slightly larger. As described above, the film characteristics of a silicon nitride film formed under the film formation conditions 1 to 3 are each different. As a result, a silicon nitride film formed under the film formation conditions 2 and 3 having a small amount of N—H bonds is used as the second inorganic insulating layer 233 in contact with the resin mask 235, and the silicon nitride film formed under the film formation condition 1 may be used as the first inorganic insulating layer 231.

In the present embodiment, although a case was explained where the first inorganic insulating layer 231 is formed under the film formation condition 1 and the second inorganic insulating layer 233 is formed under the film formation condition 2, the present embodiment is not limited thereto. For example, the first inorganic insulating layer 231 may be formed under the film formation condition 2 or the film formation condition 3. Whether the first inorganic insulating layer 231 is formed under the film formation condition 1, the film formation condition 2, or the film formation condition 3 may be appropriately set while considering productivity and characteristics of the organic EL.

For example, when the second inorganic insulating layer 233 is formed under the first film formation conditions, the silicon nitride film reacts with a resin mask formed later, and there is a danger that ammonia may be generated which changes the color of the polarization plate to white. On the other hand, when the second inorganic insulating layer 233 is formed under the second film formation condition or the third film formation condition, the reaction between the silicon nitride film and the resin mask formed later is suppressed and it is possible to reduce the generation of ammonia. In this way, it is possible to suppress whitening of the polarization plate.

<Structure of Periphery Region>

Figure 6:
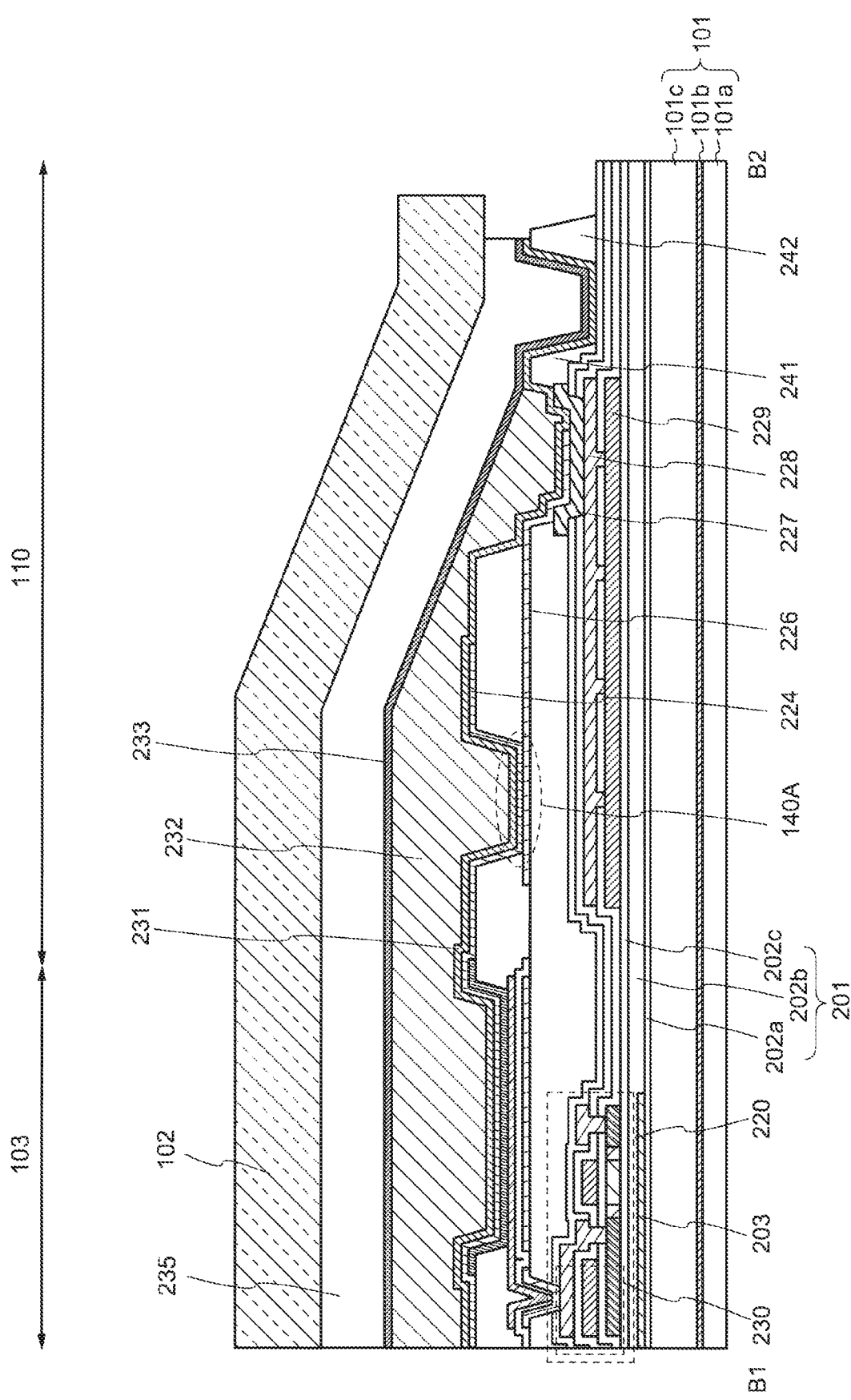
FIG. 6 is a cross-sectional view along the line B1-B2 of the display region in FIG. 1.
Figure 7:
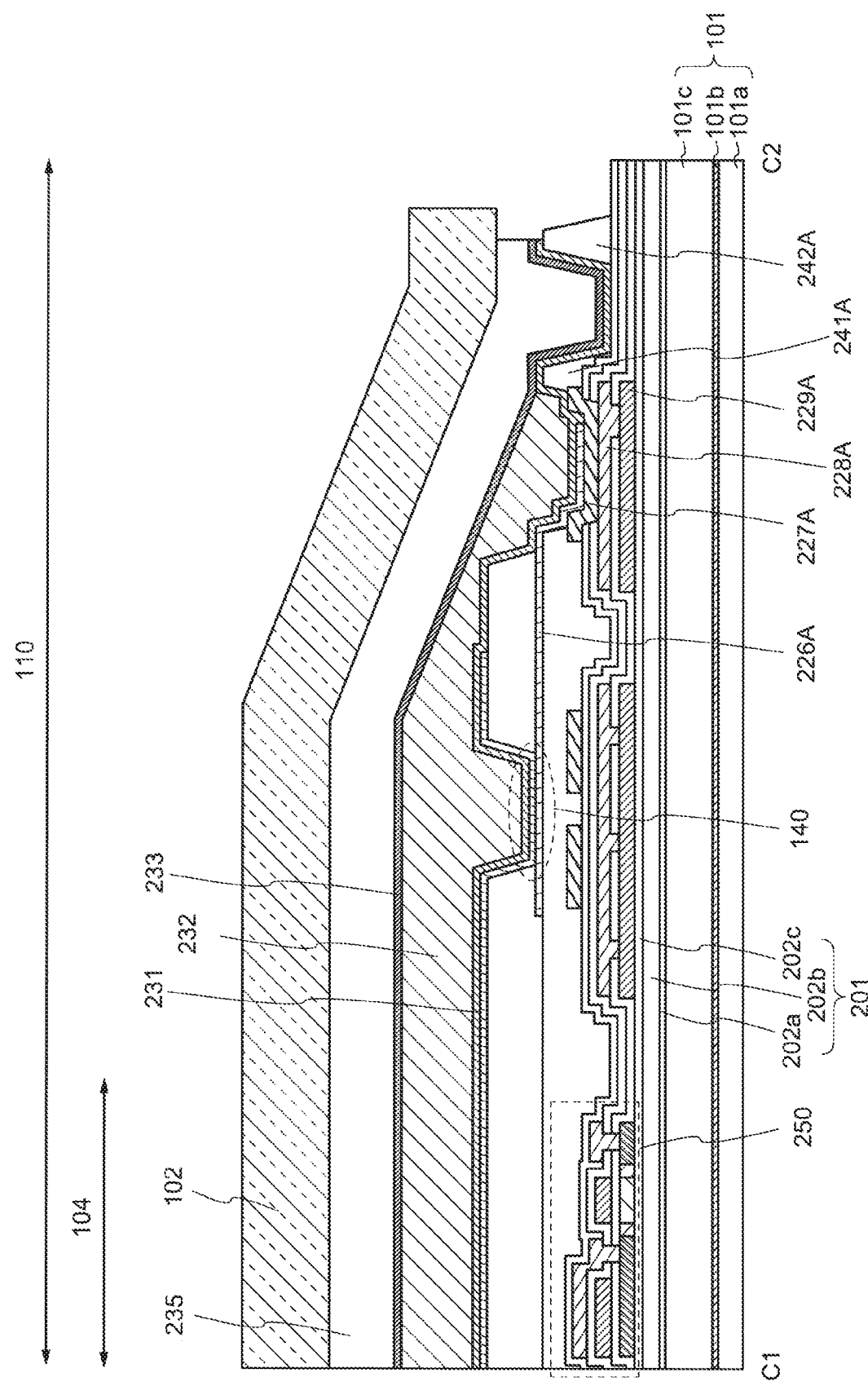
FIG. 7 is a cross-sectional view along the line C1-C2 of the display region in FIG. 1.
Figure 8:
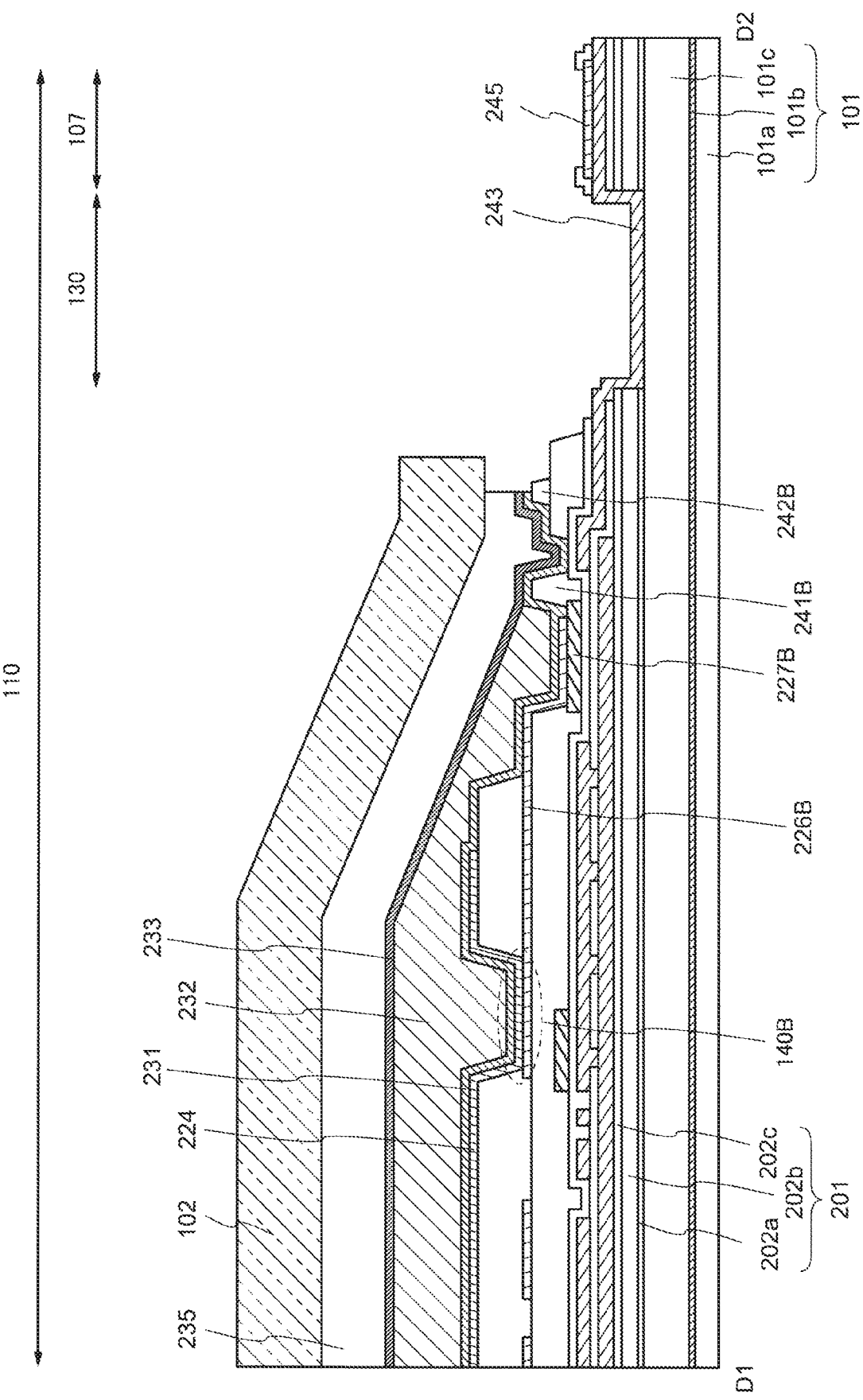
FIG. 8 is a cross-sectional view along the line D1-D2 of the display region in FIG. 1.

Next, a structure of a cross section in the periphery region 110 of the display device 100 us explained while referring to FIG. 6 to FIG. 8.

FIG. 6 is a cross-sectional view of the display device 100 shown in FIG. 1 along a line B1-B2. The upper part of the periphery region 110 of the substrate 101 shown in FIG. 6 is a region where various wirings are routed. As shown in FIG. 6, in the periphery region 110, the counter electrode 224 of the light emitting element 240 is arranged with a cathode contact 140 connected to the transparent conductive film 226. The transparent conductive film 226 is electrically connected to a conductive layer 227, a conductive layer 228 and a wiring layer 229. That is, the counter electrode 224 is electrically connected to any of the plurality of terminals 107 by the wiring layer 229.

Convex shaped insulating layers 241 and 242 which are called dams are arranged at the end parts of the substrate 101. The organic insulating layer 232 is dammed by the insulating layer 241. In addition, the first inorganic insulating layer 231 and the second inorganic insulating layer 233 are arranged up to the insulating layer 242. In addition, the first inorganic insulating layer 231 and the second inorganic insulating layer 233 include a region which contacts with the insulating layer 242 from the insulating layer 241. By sealing the organic insulating layer 232 with the first inorganic insulating layer 231 and the second inorganic insulating layer 233, it is possible to suppress moisture entering which has entered from the exterior from reaching the light emitting element 240 via the organic insulating layer 232.

FIG. 7 is a cross-sectional view of the display device 100 shown in FIG. 1 along the line C1-C2. A periphery region 110 of the substrate 101 shown in FIG. 7 is a region where a scanning line drive circuit 104 is arranged. As shown in FIG. 7, the scanning line drive circuit 104 is arranged with a transistor 250. The transistor 250 may have the same structure or a different structure from the transistors 210 and 220 which are in the pixel 109. The light shielding layer 203 is not necessarily arranged in the scanning line driver circuit 104.

In addition, the counter electrode 224 is arranged with a cathode contact 140A connected to the transparent conductive film 226A in a region between the scanning line drive circuit 104 and the end part of the substrate 101. The transparent conductive film 226A is electrically connected to the conductive layer 227A, the conductive layer 228A and the wiring layer 229A. That is, the counter electrode 224 is electrically connected to any of the plurality of terminals 107 by the wiring layer 229A.

FIG. 8 is a cross-sectional view of the display device 100 shown in FIG. 1 along the line D1-D2. A periphery region 110 of the substrate 101 shown in FIG. 9 includes a bent region 130 and a plurality of terminals 107.

The counter electrode 224 of the light emitting element 240 is arranged with a cathode contact 140B which is connected to a transparent conductive film 226. The wiring layer 243 is a lead wiring. The wiring layer 243 extends in the periphery region 110 and is exposed near the end part of the periphery region 110. A region in contact with the wiring layer 243 and the transparent conductive film 245 becomes the terminal 107.

As the substrate 101 is bent, particularly since the inorganic insulating layer has poor toughness, and easily cracks, the inorganic insulating layer is removed in the bent region 130. In order to secure the strength of this region, a resin layer or the like may be further arranged above the wiring layer 244 so as to cover the bent region 130.

Second Embodiment

Another example of the structure of the display device 100 related to one embodiment of the present invention is explained while referring to FIG. 10 to FIG. 13. In the present embodiment, a display device 100A is explained in which a touch sensor 120 is provided above a sealing film 260.

Figure 9:
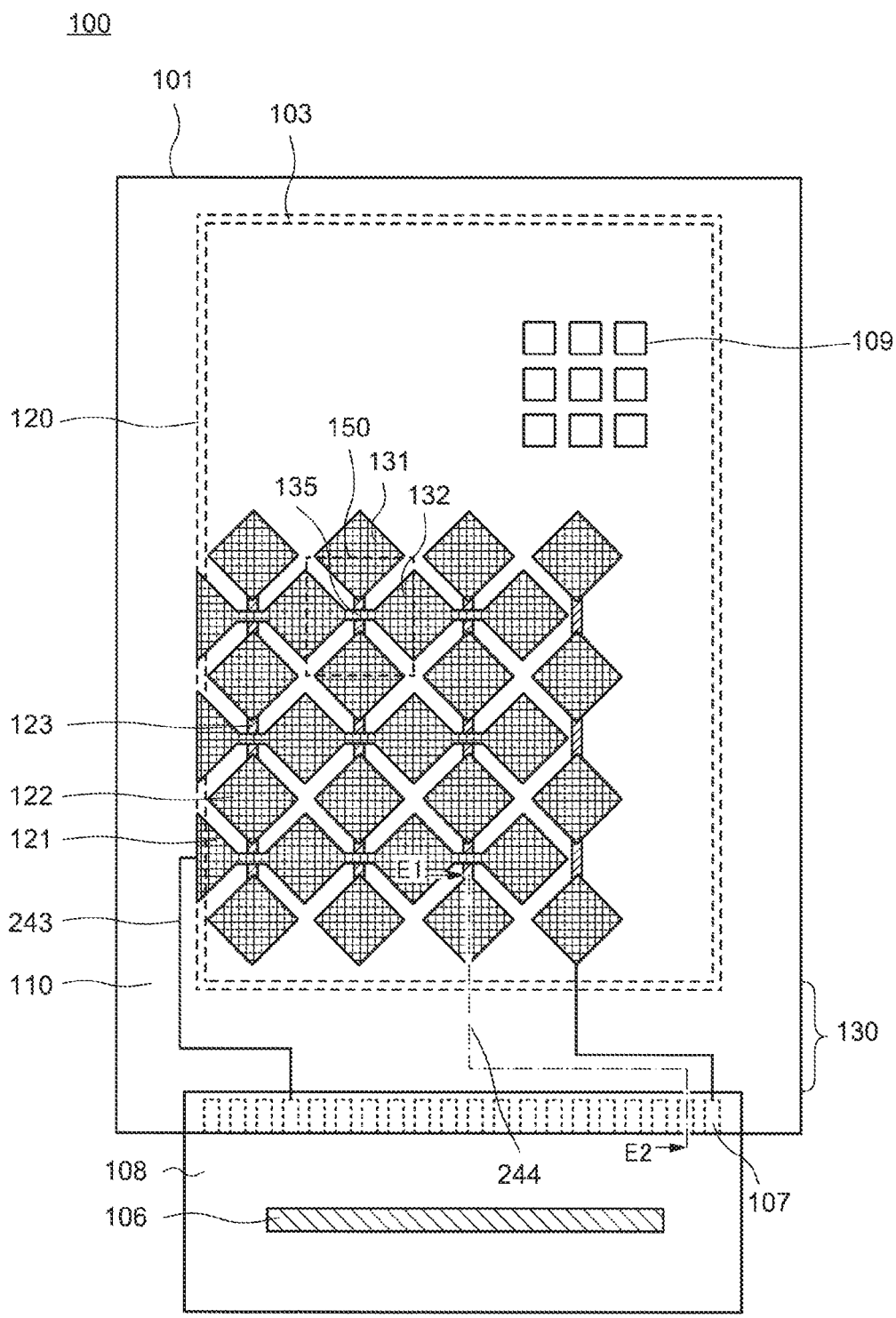
FIG. 9 is a schematic view showing a structure of a display device related to one embodiment of the present invention.

FIG. 9 is a planar diagram of a display device 100A related to one embodiment of the present invention. Apart from a touch sensor 120 being provided so as to overlap the display region 103 which is provided over the substrate 101, and the scanning line drive circuit 104 and the polarizing plate 102 not being shown in the diagram, the structure of the display device 100A shown in FIG. 9 is the same as that of the display device 100 shown in FIG. 1.

The touch sensor 120 includes a plurality of sensor electrodes 121 arranged in a stripe shape in a row direction and a plurality of sensor electrodes 122 arranged in a stripe shape in a column direction. One of the sensor electrode 121 and the sensor electrode 122 is also called a transmission electrode (Tx), and the other is also called a reception electrode (Rx). Each sensor electrode 121 and each sensor electrode 122 are separated from each other, and a capacitance is formed between them. For example, the capacitance changes when a human finger or the like touches the display region 103 via the sensor electrode 121 and the sensor electrode 122 (referred to as a touch herein), and the position of the touch is determined by reading this change. In this way, the sensor electrode 121 and the sensor electrode 122 form a so-called projection capacitive touch sensor 120.

The sensor electrode 122 is electrically connected to a wiring layer 243 which is arranged in the periphery region 110 of the display region 103. The terminal 107 is connected to the flexible printed circuit substrate 108, and a touch sensor signal is applied from the driver IC 106 to the sensor electrode 122 via the terminal 107. Furthermore, the wiring layer 243 may also be provided in a region which overlaps the scanning line driver circuit 104.

Similarly, the sensor electrode 121 is electrically connected to the wiring layer 244 which is arranged in the periphery region 110 of the display region 103. The terminal 107 is connected to the flexible printed circuit substrate 108, and a touch sensor signal is applied from the driver IC 106 to the sensor electrode 122 via the terminal 107.

In the touch sensor 120, the sensor electrode 121 includes a plurality of conductive layers 131 which have a substantially square shape, and a connection electrode 123, and the sensor electrode 122 includes a plurality of conductive layers which have a substantially square shape, and a connection region 135. In addition, the sensor electrode 121 and the sensor electrode 122 are electrically independent and separated from each other.

Figure 10:
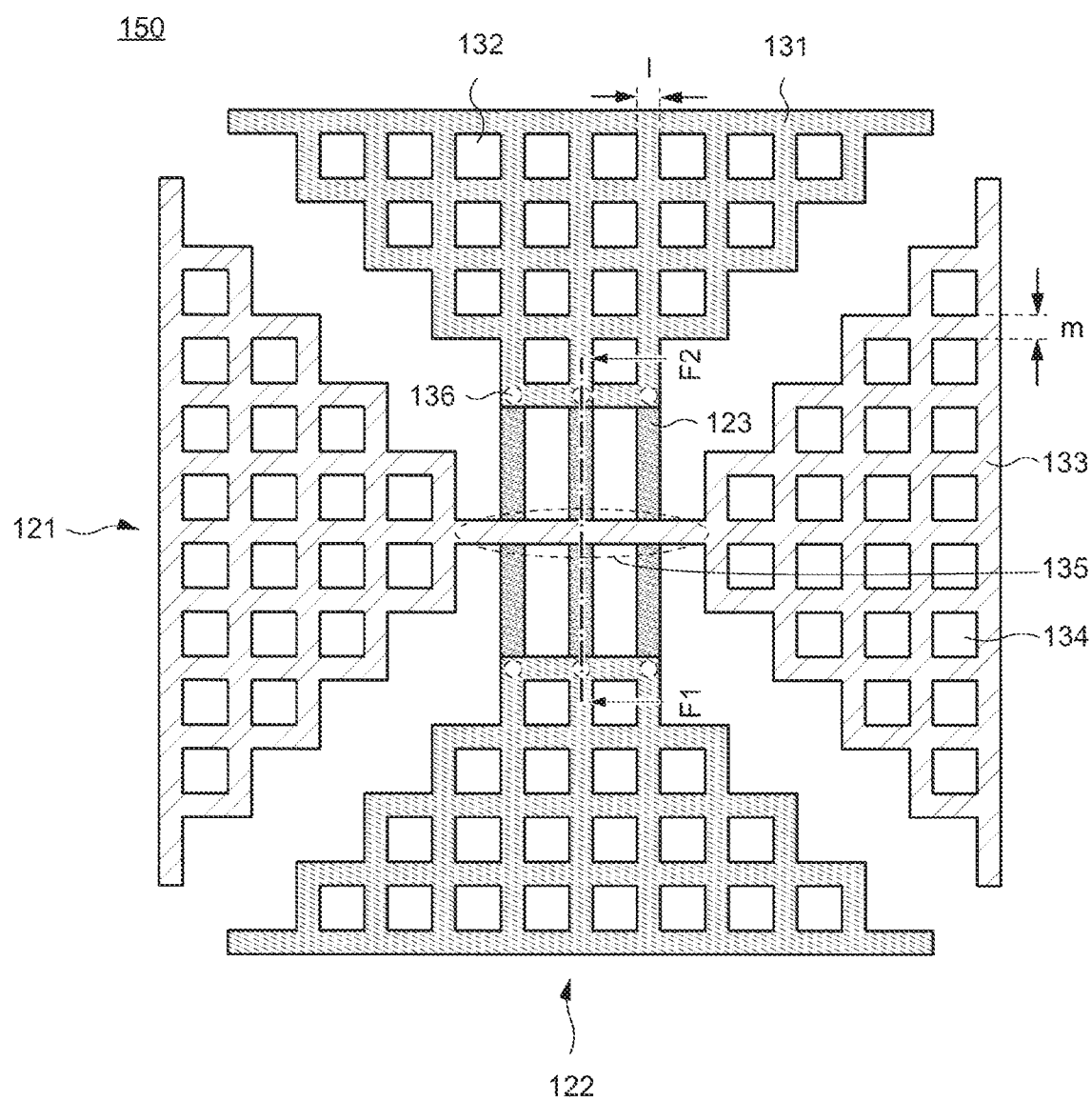
FIG. 10 is an expanded view of a part of the display device shown in FIG. 9.

FIG. 10 is an expanded diagram of a region 150 in the display device 100A shown in FIG. 9. Although different hatchings are shown in FIG. 10 in order to distinguish the sensor electrode 121 and the sensor electrode 122, the sensor electrode 121 and the sensor electrode 122 are formed from the same conductive layer. In the sensor electrode 121, conductive layers 133 which are adjacent left and right are connected via a connection region 135. In the sensor electrode 122, conductive layers 131 which are adjacent up and down are connected via the connection electrode 123. The sensor electrode 121 includes a plurality of conductive layers 133 and a plurality of openings 134, and the sensor electrode 122 includes a plurality of conductive layers 131 and a plurality of openings 132. In each of the conductive layers 131 and the conductive layers 133, the plurality of openings 132 and the plurality of openings 134 are arranged in a matrix. In this way, the conductive layer 131 and the conductive layer 133 have a mesh shape. Here, a width I of wiring which forms the conductive layer 131 is 1 μm or more and 10 μm or less, or 2 μm or more and 8 μm or less and typically 5 μm. Similarly, a width m of wiring which forms the conductive layer 133 is 1 μm or more and 10 μm or less, or 2 μm or more and 8 μm or less and typically 5 μm.

As shown in FIG. 10, the connection region 135 which connects left and right conductive layers 133 is arranged along a first direction, and the connection electrode 123 which connects up and down conductive layers 131 is arranged in a second direction which intersects the first direction. In other words, the connection electrode 123 has a region which intersects a part of the sensor electrode 121. Furthermore, although the width of the connection electrode 123 is shown as the same width as the width I of the conductive layer 131 in FIG. 10, it may also be larger than the width I of the conductive layer 131. The connection electrode 123 is preferred not to overlap the light emitting region of the light emitting element 240 of the pixel 109.

Figure 11:
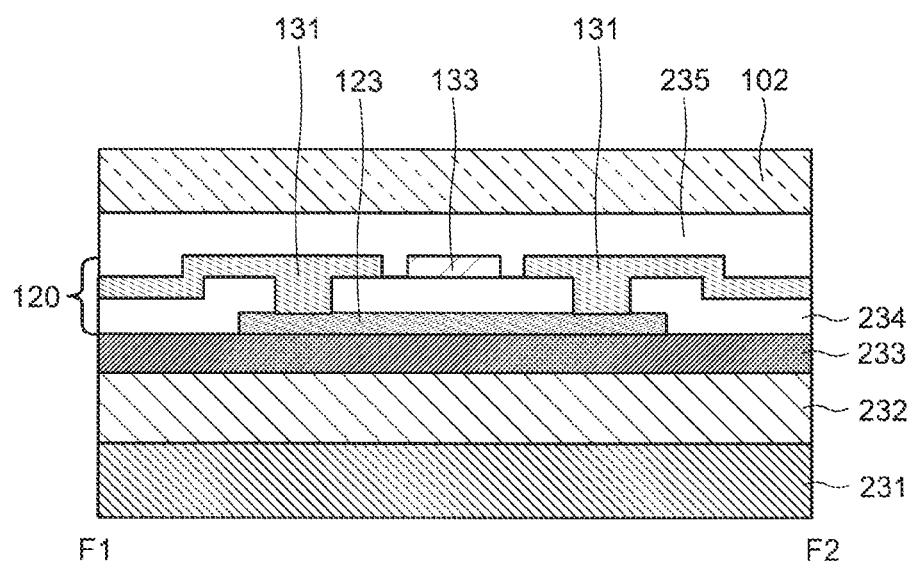
FIG. 11 is a cross-sectional view along the line F1-F2 of the display device shown in FIG. 10.

FIG. 11 is a cross-sectional view along the line F1-F2 of the touch sensor 120 shown in FIG. 10. Furthermore, an illustration of the structure below the first inorganic insulating layer 231 is omitted in FIG. 11. As shown in FIG. 11, a third inorganic insulating layer 234 is arranged under the sensor electrode 121 and the sensor electrode 122 in order to prevent the sensor electrode 121 and the sensor electrode 122 from contacting each other. Next, the connection electrode 123 for connecting conductive layers 131 adjacent up and down above and below the sensor electrode 122 is arranged via the third inorganic insulating layer 234. In this way, it is possible to prevent the sensor electrode 121 and the sensor electrode 122 from contacting each other in the region where the sensor electrode 121 and the sensor electrode 122 intersect.

Similar to the first inorganic insulating layer 231 and the second inorganic insulating layer 233, for example, the third inorganic insulating layer 251 uses a silicon nitride film, a silicon nitride oxide film or an aluminum nitride film or the like. In addition, the third inorganic insulating layer 234 is in contact with the resin mask 235. As a result, the third inorganic insulating layer 234 is a film which is more difficult to be oxidized than the first inorganic insulating layer 231. That is, the second inorganic insulating layer 233 is a film in which the N—H bond amount per unit area [% area] measured by the FT-IR method is lower than the N—H bonds per unit area [% area] of the first inorganic insulating layer.

The fact that the third inorganic insulating layer 234 is difficult to oxidize can be indicated by the thickness of the surface oxidation region of the third inorganic insulating layer 234, for example. For example, the thickness of the surface oxidation region on the side surface of the third inorganic insulating layer 324 may be set smaller than the thickness of the surface oxidation region on the side surface of the first inorganic insulating layer 321. The thickness of the surface oxidation region of the third inorganic insulating layer 234 is preferred to be 60 nm or less, for example.

In addition, the density of the third inorganic insulating layer 234 is preferred to be higher than the density of the first inorganic insulating layer 231. For example, the etching rate of the third inorganic insulating layer 234 with 1% of a buffered hydrofluoric acid is preferred to be slower than the etching rate of the first inorganic insulating layer 231. In addition, the etching rate of the third inorganic insulating layer 234 with 1% of a buffer is 7 nm/sec, for example.

In order to make the third inorganic insulating layer 234 a film which is more difficult to oxidize than the first inorganic insulating layer 231, or a dense film, a film is formed using the film formation condition 1 explained in the first embodiment, or a film is formed using the film formation conditions 2 or 3 for forming the third inorganic insulating layer 234.

By making the third inorganic insulating layer 234 a film more difficult to oxidize or a more dense film than the first inorganic insulating layer 231, it is possible to suppress a reaction between moisture contained in the resin mask 235 and moisture entering from the exterior and the second inorganic insulating layer 234. That is, it is possible to suppress the generation of ammonia. Therefore, since ammonia can be prevented from reaching the polarization plate 102 via the resin mask 235, it is possible to suppress color loss of the polarization plate 102. In this way, it is possible to improve the reliability of the display device 100.

In the present embodiment, it is the third inorganic insulating layer 234 which is in contact with the resin mask 235. As a result, the second inorganic insulating layer 233 which is arranged below the third inorganic insulating layer 234 may be formed by any of the film formation conditions 1, 2, and 3. In this way, whether the second inorganic insulating layer 233 is formed under the film formation condition 1, the film formation condition 2 or the film formation condition 3 may be appropriately determined in consideration of productivity and the characteristics of the organic EL. For example, in order to make the second inorganic insulating layer 233 a film which is more difficult to oxidize or is a denser film than the first inorganic insulating layer 231, the film forming condition 1 explained in the first embodiment may be used for the first inorganic insulating layer 231, and the second inorganic insulating layer 233 may be formed using the film formation conditions 2 or 3. In addition, a detailed explanation is omitted since it is sufficient to reference the first embodiment with respect to the film characteristics in the case when the second inorganic insulating layer 233 is formed under the film forming conditions 2 or 3.

In addition, in the case when the second inorganic insulating layer 233 and the third inorganic insulating layer 234 are films which are more difficult to oxidize than the first inorganic insulating layer 231 or are dense films, the film formation conditions may be the same or may be different. Whether each of the second inorganic insulating layer 233 and the third inorganic insulating layer 234 is formed under any of the film formation condition 2 or the film formation condition 3 can be appropriately determined in consideration of productivity and the characteristics of the organic EL.

Figure 12:
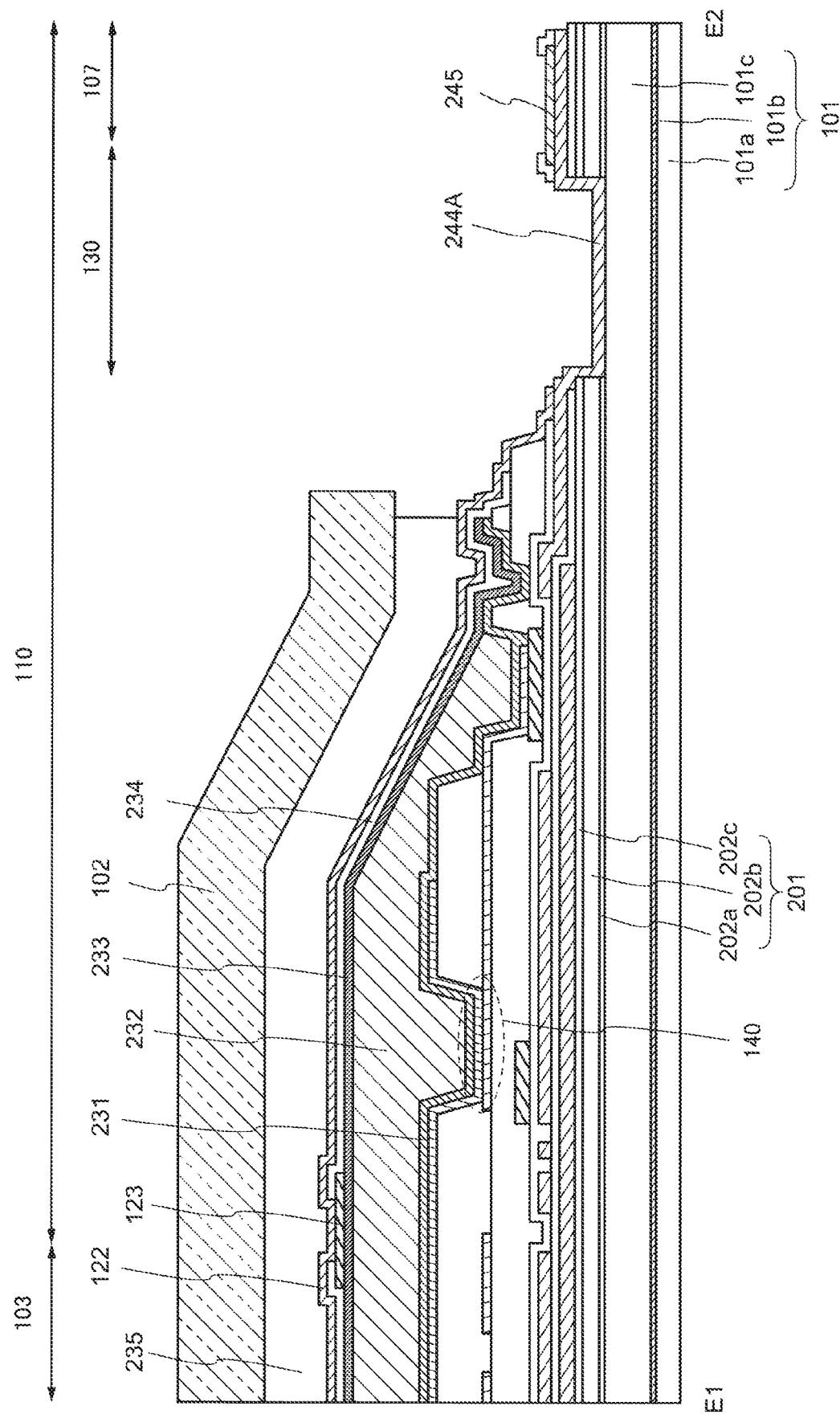
FIG. 12 is a cross-sectional view along the line E1-E2 of the display region shown in FIG. 9.

FIG. 12 is a cross-sectional view along line E1-E2 of the display device 100A shown in FIG. 9. The structure from the substrate 101 to the sealing film 260 is the same as in FIG. 1. In the present embodiment, the touch sensor 120 is arranged above the second inorganic insulating layer 233 of the sealing film 260. FIG. 12 shows a connection region between the sensor electrode 122 and the connection electrode 123. The connection electrode 123 is arranged above the second inorganic insulating layer 233, the third inorganic insulating layer 234 is arranged above the connection electrode 123, and the sensor electrode 122 is arranged above the third inorganic insulating layer 234. The wiring layer 244A extends in the periphery region 110 and is exposed near the end part of the periphery region 110. A region in contact with the wiring layer 244A and the transparent conductive film 245 becomes the terminal 107.

In the periphery region 110 which surrounds the display region 103, the third inorganic insulating layer 234 is in contact with a side surface of the first inorganic insulating layer 231 and a side surface of the second inorganic insulating layer 233, and it is possible to suppress the entrance of moisture from the side surface of the first inorganic insulating layer 231 and the side surface of the second inorganic insulating layer 233. In this way, it is possible to suppress a reaction occurs between entered moisture and a film containing nitrogen whereby ammonia is generated, and it is possible to prevent discoloring of the polarization plate 102 to white.

In addition, in the periphery region 110 which surrounds the display region 103, the sensor electrode 122 is in contact with the side surface of the third inorganic insulating layer 234 and thereby it is possible to suppress moisture from entering from the side surface of the third inorganic insulating layer 234. In this way, it is possible to suppress a reaction occurs between entered moisture and a film containing nitrogen whereby ammonia is generated, and it is possible to prevent discoloring of the polarization plate 102 to white.

According to the display devices 100 and 100A according to one embodiment of the present invention, it is possible to suppress a reaction between a resin mask and a silicon nitride film by making the silicon nitride film in contact with the resin mask a film which is difficult to oxidize or a dense film. In this way, the amount of ammonia which is generated by contact between the resin mask and the silicon nitride film can be reduced. Therefore, since it is possible to suppress a polarization plate turning white due to ammonia, it is possible to improve the reliability of the display devices 100 and 100A.

What is claimed is:

1. A display device comprising:
    a first substrate;
    a display region arranged with a pixel including a light emitting element above the first substrate;
    a first inorganic insulating layer covering the display region;
    an organic insulating layer arranged above the first inorganic insulating layer;
    a second inorganic insulating layer arranged above the organic insulating layer and having a N—H bond total weight measured by an FT-IR method lower than a N—H bond total weight per unit [% area] of the first inorganic insulating layer; and
    a polarizing plate arranged above the second inorganic insulating layer.

2. The display device according to claim 1, wherein a density of the second inorganic insulating layer is higher than a density of the first inorganic insulating layer.

3. The display device according to claim 1, wherein an etching rate of 1% by a buffered hydrofluoric acid of the second inorganic insulating layer is slower than an etching rate of the first inorganic insulating layer.

4. The display device according to claim 1, wherein an etching rate of 1% by a buffered hydrofluoric acid of the second inorganic insulating layer is 7 nm/sec or less.

5. The display device according to claim 1, wherein a thickness of a surface oxidation region at a side surface of the second inorganic insulating layer is smaller than a thickness of a surface oxidation region at a side surface of the first inorganic insulating layer.

6. The display device according to claim 1, wherein a thickness of a surface oxidation region of the second inorganic insulating layer is 60 nm or less.

7. The display device according to claim 1, wherein the second inorganic insulating layer contacts the first inorganic insulating layer at a periphery region surrounding the display region.

8. A display device a comprising:
    a first substrate;
    a display region arranged with a pixel including a light emitting element above the first substrate;
    a first inorganic insulating layer covering the display region;
    an organic insulating layer arranged above the first inorganic insulating layer;
    a second inorganic insulating layer arranged above the organic insulating layer;
    a first electrode arranged above the second inorganic insulating layer;
    a third inorganic insulating layer arranged above the first electrode and having a N—H bond total weight measured by an FT-IR method lower than a N—H bond total weight per unit [% area] of the first inorganic insulating layer; and
    a second electrode arranged above the third inorganic insulating layer and electrically connected to the first electrode.

9. The display device according to claim 8, wherein a density of the third inorganic insulating layer is higher than a density of the first inorganic insulating layer.

10. The display device according to claim 8, wherein an etching rate of 1% by a buffered hydrofluoric acid of the third inorganic insulating layer is slower than an etching rate of the first inorganic insulating layer.

11. The display device according to claim 8, wherein an etching rate of 1% by a buffered hydrofluoric acid of the third inorganic insulating layer is 7 nm/sec or less.

12. The display device according to claim 8, wherein a thickness of a surface oxidation region at a side surface of the third inorganic insulating layer is smaller than a thickness of a surface oxidation region at a side surface of the first inorganic insulating layer.

13. The display device according to claim 8, wherein an oxide thickness from a surface of the third inorganic insulation layer is 60 nm or less.

14. The display device according to claim 8, wherein the third inorganic insulating layer contacts a side surface of the first inorganic insulating layer and a side surface of the second inorganic insulating layer at a periphery region surrounding the display region.

15. The display device according to claim 8, wherein the second electrode contacts a side surface of the second inorganic insulating layer at a periphery region surrounding the display region.

16. The display device according to claim 8, wherein a N—H bond total weight per unit [% area] measured by an FT-IR method of the second inorganic insulating layer is lower than a N—H bond total weight per unit [% area] of the first inorganic insulating layer.

17. The display device according to claim 8, wherein a density of the second inorganic insulating layer is higher than a density of the first inorganic insulating layer.

18. The display device according to claim 8, wherein an etching rate of 1% by a buffered hydrofluoric acid of the second inorganic insulating layer is slower than an etching rate of the first inorganic insulating layer.

19. The display device according to claim 8, wherein an etching rate of 1% by a buffered hydrofluoric acid of the second inorganic insulating layer is 7 nm/sec or less.

* * * * *